(12) United States Patent
Srinivasan et al.

(10) Patent No.: US 8,268,246 B2
(45) Date of Patent: Sep. 18, 2012

(54) PCB DROPLET ACTUATOR FABRICATION

(75) Inventors: Vijay Srinivasan, Durham, NC (US);
Vamsee K. Pamula, Durham, NC (US);
Michael G. Pollack, Durham, NC (US)

(73) Assignee: Advanced Liquid Logic Inc, Research Triangle Park, NC (US)

( * ) Notice: Subject to any disclaimer, the term of this patent is extended or adjusted under 35 U.S.C. 154(b) by 95 days.

(21) Appl. No.: 12/531,794

(22) PCT Filed: Aug. 11, 2008

(86) PCT No.: PCT/US2008/072770
§ 371 (c)(1),
(2), (4) Date: Oct. 15, 2009

(87) PCT Pub. No.: WO2009/021233
PCT Pub. Date: Feb. 12, 2009

(65) Prior Publication Data
US 2010/0126860 A1 May 27, 2010

Related U.S. Application Data

(60) Provisional application No. 60/954,841, filed on Aug. 9, 2007.

(51) Int. Cl.
*B01J 8/00* (2006.01)
*G01N 27/26* (2006.01)
(52) U.S. Cl. .......................................... 422/81; 204/643
(58) Field of Classification Search .................. 204/643; 422/81, 189, 82.05; 436/53, 180
See application file for complete search history.

(56) References Cited

U.S. PATENT DOCUMENTS

| | | |
|---|---|---|
| 3,687,834 A | 8/1972 | Candor |
| 3,746,911 A | 7/1973 | Nathanson et al. |
| 3,756,693 A | 9/1973 | Ota |
| 3,795,605 A | 3/1974 | Candor |
| 3,872,480 A | 3/1975 | Engelbrecht |
| 3,930,982 A | 1/1976 | Batha et al. |
| 3,934,180 A | 1/1976 | Kiess et al. |
| 4,057,482 A | 11/1977 | Candor |
| 4,390,403 A | 6/1983 | Batchelder |
| 4,418,346 A | 11/1983 | Batchelder |

(Continued)

FOREIGN PATENT DOCUMENTS

EP 0558233 A1 9/1993

(Continued)

OTHER PUBLICATIONS

Office Action dated Oct. 7, 2009 from co-pending U.S. Appl. No. 11/343,284.

(Continued)

*Primary Examiner* — J. Christopher Ball
(74) *Attorney, Agent, or Firm* — William A. Barrett; Ward & Smith, P.A.

(57) ABSTRACT

Alternative approaches to fabricating printed circuit boards for use in droplet actuator operations are provided. In one embodiment, a method of manufacturing a droplet actuator for conducting droplet operations includes positioning a dielectric material between a first metal layer configured to include an electrode and a second metal layer configured to include an interconnect pad. The method additionally includes forming a connection between the first and second metal layers. Droplet actuators and methods of fabricating and supporting printed circuit boards of droplet actuators are also provided.

28 Claims, 7 Drawing Sheets

U.S. PATENT DOCUMENTS

| | | | |
|---|---|---|---|
| 4,430,645 A | 2/1984 | Eskandry et al. |
| 4,467,325 A | 8/1984 | Lustig |
| 4,569,575 A | 2/1986 | Le Pesant et al. |
| 4,582,391 A | 4/1986 | Legrand |
| 4,636,785 A | 1/1987 | Le Pesant |
| 4,701,021 A | 10/1987 | Le Pesant et al. |
| 4,742,345 A | 5/1988 | Di Santo |
| 4,818,052 A | 4/1989 | Le Pesant et al. |
| 4,863,849 A | 9/1989 | Melamede |
| 4,908,112 A | 3/1990 | Pace |
| 4,911,782 A | 3/1990 | Brown |
| 5,001,594 A | 3/1991 | Bobbio |
| 5,038,852 A | 8/1991 | Johnson et al. |
| 5,176,203 A | 1/1993 | Larzul |
| 5,180,480 A | 1/1993 | Manz |
| 5,181,016 A | 1/1993 | Lee |
| 5,192,659 A | 3/1993 | Simons |
| 5,194,862 A | 3/1993 | Edwards |
| 5,240,994 A | 8/1993 | Brink et al. |
| 5,276,125 A | 1/1994 | Pedain et al. |
| 5,296,114 A | 3/1994 | Manz |
| 5,454,472 A | 10/1995 | Benecke et al. |
| 5,468,374 A | 11/1995 | Knoll |
| 5,472,577 A | 12/1995 | Porter et al. |
| 5,486,337 A | 1/1996 | Ohkawa |
| 5,495,077 A | 2/1996 | Miller |
| 5,525,493 A | 6/1996 | Hornes et al. |
| 5,571,410 A | 11/1996 | Swedberg et al. |
| 5,603,351 A | 2/1997 | Cherukuri et al. |
| 5,605,662 A | 2/1997 | Heller et al. |
| 5,632,876 A | 5/1997 | Zanzucchi et al. |
| 5,632,957 A | 5/1997 | Heller et al. |
| 5,720,923 A | 2/1998 | Haff et al. |
| 5,731,792 A | 3/1998 | Sheridon |
| 5,757,345 A | 5/1998 | Sheridon |
| 5,770,391 A | 6/1998 | Foote et al. |
| 5,770,457 A | 6/1998 | Stocker et al. |
| 5,777,391 A | 7/1998 | Nakamura et al. |
| 5,795,457 A | 8/1998 | Pethig |
| 5,808,593 A | 9/1998 | Sheridon |
| 5,814,200 A | 9/1998 | Pethig et al. |
| 5,846,396 A | 12/1998 | Zanzucchi et al. |
| 5,849,486 A | 12/1998 | Heller et al. |
| 5,851,769 A | 12/1998 | Gray et al. |
| 5,858,195 A | 1/1999 | Ramsey |
| 5,871,908 A | 2/1999 | Henco et al. |
| 5,876,675 A | 3/1999 | Kennedy |
| 5,888,370 A | 3/1999 | Becker et al. |
| 5,911,533 A | 6/1999 | Fassler et al. |
| 5,921,678 A | 7/1999 | Desai et al. |
| 5,929,960 A | 7/1999 | West et al. |
| 5,948,227 A | 9/1999 | Dubrow |
| 5,948,328 A | 9/1999 | Fiedler et al. |
| 5,956,005 A | 9/1999 | Sheridon |
| 5,958,694 A | 9/1999 | Nikiforov |
| 5,980,719 A | 11/1999 | Cherukuri et al. |
| 5,989,402 A | 11/1999 | Chow et al. |
| 5,992,820 A | 11/1999 | Fare et al. |
| 5,993,630 A | 11/1999 | Becker et al. |
| 5,993,632 A | 11/1999 | Becker et al. |
| 5,994,056 A | 11/1999 | Higuchi |
| 6,001,229 A | 12/1999 | Ramsey |
| 6,010,607 A | 1/2000 | Ramsey |
| 6,010,608 A | 1/2000 | Ramsey |
| 6,017,696 A | 1/2000 | Heller |
| 6,022,463 A | 2/2000 | Leader |
| 6,033,546 A | 3/2000 | Ramsey |
| 6,042,710 A | 3/2000 | Dubrow |
| 6,048,498 A | 4/2000 | Kennedy |
| 6,056,861 A | 5/2000 | Fuhr et al. |
| 6,057,149 A | 5/2000 | Burns et al. |
| 6,068,752 A | 5/2000 | Dubrow et al. |
| 6,068,818 A | 5/2000 | Ackley et al. |
| 6,071,394 A | 6/2000 | Cheng et al. |
| 6,086,243 A | 7/2000 | Paul et al. |
| 6,086,740 A | 7/2000 | Kennedy |
| 6,093,296 A | 7/2000 | Soane et al. |
| 6,099,803 A | 8/2000 | Ackley et al. |
| 6,106,685 A | 8/2000 | McBride et al. |
| 6,107,044 A | 8/2000 | Nikiforov |
| 6,109,717 A | 8/2000 | Kane et al. |
| 6,110,426 A | 8/2000 | Shalon et al. |
| 6,123,798 A | 9/2000 | Gandhi et al. |
| 6,124,851 A | 9/2000 | Jacobsen |
| 6,126,800 A | 10/2000 | Calliat et al. |
| 6,130,098 A | 10/2000 | Handique et al. |
| 6,136,171 A | 10/2000 | Frazier et al. |
| 6,136,212 A | 10/2000 | Mastrangelo et al. |
| 6,148,508 A | 11/2000 | Wolk |
| 6,153,073 A | 11/2000 | Dubrow et al. |
| 6,154,226 A | 11/2000 | York et al. |
| 6,156,181 A | 12/2000 | Parce et al. |
| 6,167,910 B1 | 1/2001 | Chow |
| 6,169,394 B1 | 1/2001 | Frazier et al. |
| 6,170,981 B1 | 1/2001 | Regnier et al. |
| 6,171,785 B1 | 1/2001 | Higuchi et al. |
| 6,174,675 B1 | 1/2001 | Chow et al. |
| 6,176,990 B1 | 1/2001 | Yager et al. |
| 6,210,891 B1 | 4/2001 | Nyren et al. |
| 6,211,477 B1 | 4/2001 | Cadott et al. |
| 6,213,151 B1 | 4/2001 | Jacobsen et al. |
| 6,225,059 B1 | 5/2001 | Ackley et al. |
| 6,231,177 B1 | 5/2001 | Cherukuri et al. |
| 6,235,471 B1 | 5/2001 | Knapp et al. |
| 6,251,343 B1 | 6/2001 | Dubrow et al. |
| 6,251,595 B1 | 6/2001 | Gordon et al. |
| 6,258,568 B1 | 7/2001 | Nyren |
| 6,261,430 B1 | 7/2001 | Yager et al. |
| 6,274,089 B1 | 8/2001 | Chow et al. |
| 6,280,590 B1 | 8/2001 | Cheng et al. |
| 6,294,063 B1 | 9/2001 | Becker et al. |
| 6,318,970 B1 | 11/2001 | Backhouse |
| 6,319,668 B1 | 11/2001 | Nova et al. |
| 6,342,142 B1 | 1/2002 | Ramsey |
| 6,352,838 B1 | 3/2002 | Krulevitch et al. |
| 6,355,198 B1 | 3/2002 | Kim et al. |
| 6,379,929 B1 | 4/2002 | Burns et al. |
| 6,409,698 B1 | 6/2002 | Robinson et al. |
| 6,432,290 B1 | 8/2002 | Harrison et al. |
| 6,473,492 B2 | 10/2002 | Prins |
| 6,482,306 B1 | 11/2002 | Yager et al. |
| 6,485,913 B1 | 11/2002 | Becker et al. |
| 6,491,803 B1 | 12/2002 | Shen et al. |
| 6,492,122 B2 | 12/2002 | Weidenhammer et al. |
| 6,538,823 B2 | 3/2003 | Kroupenkine et al. |
| 6,545,815 B2 | 4/2003 | Kroupenkine et al. |
| 6,565,727 B1 | 5/2003 | Shenderov |
| 6,596,238 B1 | 7/2003 | Belder et al. |
| 6,600,888 B2 | 7/2003 | Mishra et al. |
| 6,602,400 B1 | 8/2003 | Choong et al. |
| 6,605,453 B2 | 8/2003 | Ozkan et al. |
| 6,613,560 B1 | 9/2003 | Tso et al. |
| 6,629,826 B2 | 10/2003 | Yoon et al. |
| 6,661,563 B2 | 12/2003 | Hayashi et al. |
| 6,665,127 B2 | 12/2003 | Bao et al. |
| 6,673,225 B1 | 1/2004 | Arnold |
| 6,681,788 B2 | 1/2004 | Parce et al. |
| 6,692,700 B2 | 2/2004 | Handique |
| 6,761,962 B2 | 7/2004 | Bentsen et al. |
| 6,767,706 B2 | 7/2004 | Quake et al. |
| 6,773,566 B2 | 8/2004 | Shenderov |
| 6,790,330 B2 | 9/2004 | Gascoyne et al. |
| 6,814,934 B1 | 11/2004 | Higuchi |
| 6,828,100 B1 | 12/2004 | Ronaghi |
| 6,841,128 B2 | 1/2005 | Kambara et al. |
| 6,866,762 B2 | 3/2005 | Gascoyne et al. |
| 6,887,362 B2 | 5/2005 | Huang et al. |
| 6,893,547 B2 | 5/2005 | Gascoyne et al. |
| 6,896,855 B1 | 5/2005 | Kohler et al. |
| 6,897,848 B2 | 5/2005 | Sheridon |
| 6,911,132 B2 | 6/2005 | Pamula et al. |
| 6,949,176 B2 | 9/2005 | Vacca et al. |
| 6,958,132 B2 | 10/2005 | Chiou et al. |
| 6,960,437 B2 | 11/2005 | Enzelberger et al. |
| 6,989,086 B2 | 1/2006 | Cheng et al. |
| 6,989,234 B2 | 1/2006 | Kolar et al. |
| 7,014,747 B2 | 3/2006 | Cummings et al. |

| | | | |
|---|---|---|---|
| 7,033,473 B2 | 4/2006 | Gascoyne et al. |
| 7,075,162 B2 | 7/2006 | Unger |
| 7,078,168 B2 | 7/2006 | Sylvan |
| 7,081,192 B1 | 7/2006 | Wang |
| 7,147,763 B2 | 12/2006 | Elrod et al. |
| 7,167,156 B1 | 1/2007 | Glass |
| 7,183,509 B2 | 2/2007 | Beerling |
| 7,189,359 B2 | 3/2007 | Yuan et al. |
| 7,189,560 B2 | 3/2007 | Kim et al. |
| 7,329,545 B2 | 2/2008 | Pamula et al. |
| 7,338,760 B2 | 3/2008 | Gong et al. |
| 7,439,014 B2 | 10/2008 | Pamula et al. |
| 7,547,380 B2 | 6/2009 | Velev |
| 7,604,718 B2 | 10/2009 | Zhang et al. |
| 7,687,280 B2 | 3/2010 | Woudenberg et al. |
| 7,699,969 B2 | 4/2010 | Manaresi et al. |
| 7,815,871 B2 | 10/2010 | Pamula et al. |
| 7,816,121 B2 | 10/2010 | Pollack et al. |
| 7,833,711 B2 | 11/2010 | Woudenberg et al. |
| 7,833,719 B2 | 11/2010 | O'Keefe et al. |
| 7,888,108 B2 | 2/2011 | Woudenberg et al. |
| 7,919,048 B2 | 4/2011 | Wo |
| 2001/0055242 A1 | 12/2001 | Deshmukh et al. |
| 2002/0043463 A1 | 4/2002 | Shenderov |
| 2002/0058332 A1 | 5/2002 | Quake et al. |
| 2002/0063060 A1 | 5/2002 | Gascoyne et al. |
| 2002/0088712 A1 | 7/2002 | Miles |
| 2002/0093651 A1 | 7/2002 | Roe |
| 2002/0100612 A1 | 8/2002 | Crockett et al. |
| 2002/0125134 A1 | 9/2002 | Santiago et al. |
| 2002/0125135 A1 | 9/2002 | Derand et al. |
| 2002/0128546 A1 | 9/2002 | Silver |
| 2002/0168671 A1 | 11/2002 | Burns et al. |
| 2002/0172969 A1 | 11/2002 | Burns et al. |
| 2003/0006140 A1 | 1/2003 | Vacca et al. |
| 2003/0006141 A1 | 1/2003 | Gerlach et al. |
| 2003/0012483 A1 | 1/2003 | Ticknor et al. |
| 2003/0012699 A1 | 1/2003 | Moore et al. |
| 2003/0049632 A1 | 3/2003 | Edman et al. |
| 2003/0082081 A1 | 5/2003 | Fouillet et al. |
| 2003/0103021 A1 | 6/2003 | Young et al. |
| 2003/0119057 A1 | 6/2003 | Gascoyne et al. |
| 2003/0121788 A1 | 7/2003 | Gascoyne et al. |
| 2003/0164295 A1 | 9/2003 | Sterling |
| 2003/0175947 A1 | 9/2003 | Liu et al. |
| 2003/0175990 A1 | 9/2003 | Hayenga et al. |
| 2003/0183525 A1 | 10/2003 | Elrod et al. |
| 2003/0205632 A1 | 11/2003 | Kim et al. |
| 2003/0206351 A1 | 11/2003 | Kroupenkine |
| 2003/0224528 A1 | 12/2003 | Chiou et al. |
| 2003/0227100 A1 | 12/2003 | Chandross et al. |
| 2004/0007377 A1 | 1/2004 | Fouillet et al. |
| 2004/0031688 A1 | 2/2004 | Shenderov |
| 2004/0042721 A1 | 3/2004 | Kroupenkine et al. |
| 2004/0053290 A1 | 3/2004 | Terbrueggen et al. |
| 2004/0055536 A1 | 3/2004 | Kolar et al. |
| 2004/0055891 A1 | 3/2004 | Pamula et al. |
| 2004/0058450 A1 | 3/2004 | Pamula et al. |
| 2004/0091392 A1 | 5/2004 | McBridge et al. |
| 2004/0136876 A1 | 7/2004 | Fouillet et al. |
| 2004/0141884 A1 | 7/2004 | Unno et al. |
| 2004/0144651 A1 | 7/2004 | Huang et al. |
| 2004/0180346 A1 | 9/2004 | Anderson et al. |
| 2004/0211659 A1 | 10/2004 | Velev |
| 2004/0211669 A1 | 10/2004 | Cummings et al. |
| 2004/0231987 A1 | 11/2004 | Sterling et al. |
| 2005/0038329 A1 | 2/2005 | Morris et al. |
| 2005/0048581 A1 | 3/2005 | Chiu et al. |
| 2005/0056569 A1 | 3/2005 | Yuan et al. |
| 2005/0064423 A1 | 3/2005 | Higuchi et al. |
| 2005/0100675 A1 | 5/2005 | Mao et al. |
| 2005/0106742 A1 | 5/2005 | Wahl |
| 2005/0142037 A1 | 6/2005 | Reihs |
| 2005/0148042 A1 | 7/2005 | Prestwich et al. |
| 2005/0158755 A1 | 7/2005 | Lee et al. |
| 2005/0179746 A1 | 8/2005 | Roux et al. |
| 2005/0227264 A1 | 10/2005 | Nobile et al. |
| 2005/0272159 A1 | 12/2005 | Ismagilov et al. |
| 2005/0287572 A1 | 12/2005 | Mathies et al. |
| 2006/0021875 A1 | 2/2006 | Griffith et al. |
| 2006/0054503 A1 | 3/2006 | Pamula et al. |
| 2006/0068450 A1 | 3/2006 | Combette et al. |
| 2006/0102477 A1 | 5/2006 | Vann et al. |
| 2006/0114296 A1 | 6/2006 | Gascoyne et al. |
| 2006/0132543 A1 | 6/2006 | Elrod et al. |
| 2006/0166261 A1 | 7/2006 | Higuchi et al. |
| 2006/0166262 A1 | 7/2006 | Higuchi et al. |
| 2006/0172336 A1 | 8/2006 | Higuchi et al. |
| 2006/0186048 A1 | 8/2006 | Tan |
| 2006/0194331 A1 | 8/2006 | Pamula et al. |
| 2006/0254933 A1 | 11/2006 | Adachi et al. |
| 2007/0023292 A1 | 2/2007 | Kim et al. |
| 2007/0037294 A1 | 2/2007 | Pollack et al. |
| 2007/0115308 A1 | 5/2007 | Hisano et al. |
| 2007/0141593 A1 | 6/2007 | Lee et al. |
| 2007/0196237 A1 | 8/2007 | Neuzil et al. |
| 2007/0217956 A1 | 9/2007 | Pamula et al. |
| 2007/0241068 A1 | 10/2007 | Pamula et al. |
| 2007/0242105 A1 | 10/2007 | Srinivasan et al. |
| 2007/0242111 A1 | 10/2007 | Pamula et al. |
| 2007/0243634 A1 | 10/2007 | Pamula et al. |
| 2007/0275415 A1 | 11/2007 | Srinivasan et al. |
| 2008/0003588 A1 | 1/2008 | Hasson et al. |
| 2008/0006535 A1 | 1/2008 | Paik et al. |
| 2008/0044893 A1 | 2/2008 | Pollack et al. |
| 2008/0044914 A1 | 2/2008 | Pollack et al. |
| 2008/0050834 A1 | 2/2008 | Pollack et al. |
| 2008/0138815 A1 | 6/2008 | Brown et al. |
| 2008/0153091 A1 | 6/2008 | Brown et al. |
| 2008/0160525 A1 | 7/2008 | Brown et al. |
| 2008/0169184 A1 | 7/2008 | Brown et al. |
| 2008/0171324 A1 | 7/2008 | Brown et al. |
| 2008/0171325 A1 | 7/2008 | Brown et al. |
| 2008/0171326 A1 | 7/2008 | Brown et al. |
| 2008/0171327 A1 | 7/2008 | Brown et al. |
| 2008/0171382 A1 | 7/2008 | Brown et al. |
| 2008/0213766 A1 | 9/2008 | Brown et al. |
| 2008/0230386 A1 | 9/2008 | Srinivasan et al. |
| 2008/0247516 A1 | 10/2008 | Fink et al. |
| 2008/0247920 A1 | 10/2008 | Pollack et al. |
| 2008/0264797 A1 | 10/2008 | Pollack et al. |
| 2008/0281471 A1 | 11/2008 | Smith et al. |
| 2009/0042319 A1 | 2/2009 | De Guzman et al. |
| 2009/0053726 A1 | 2/2009 | Owen et al. |
| 2009/0127123 A1 | 5/2009 | Raccurt et al. |
| 2009/0134009 A1 | 5/2009 | Roux et al. |
| 2009/0145485 A1 | 6/2009 | Smith et al. |
| 2009/0145576 A1 | 6/2009 | Wyrick et al. |
| 2009/0146380 A1 | 6/2009 | Votaw et al. |
| 2009/0155902 A1 | 6/2009 | Pollack et al. |
| 2009/0205963 A1 | 8/2009 | Medoro et al. |
| 2009/0218223 A1 | 9/2009 | Manaresi et al. |
| 2009/0291433 A1 | 11/2009 | Pollack et al. |
| 2010/0096266 A1 | 4/2010 | Kim |
| 2010/0116640 A1 | 5/2010 | Pamula et al. |
| 2010/0140093 A1 | 6/2010 | Pamula et al. |
| 2010/0307917 A1 | 12/2010 | Srinivasan et al. |
| 2010/0307922 A1 | 12/2010 | Wu |
| 2010/0320088 A1 | 12/2010 | Fouillet et al. |
| 2011/0003281 A1 | 1/2011 | Woudenberg et al. |
| 2011/0042220 A1 | 2/2011 | Wang |
| 2011/0056834 A1 | 3/2011 | Fan |
| 2011/0065590 A1 | 3/2011 | Hunter |

FOREIGN PATENT DOCUMENTS

| | | |
|---|---|---|
| KR | 20070037432 A | 4/2007 |
| WO | 9523020 A1 | 8/1995 |
| WO | 9604547 A1 | 2/1996 |
| WO | 9822625 A1 | 5/1998 |
| WO | 9915876 A1 | 4/1999 |
| WO | 9917093 A1 | 4/1999 |
| WO | 0047322 A2 | 4/2000 |
| WO | 030693080 A1 | 8/2003 |
| WO | 2004027490 A1 | 4/2004 |
| WO | 2004073863 A2 | 9/2004 |
| WO | 2006026351 A1 | 3/2006 |
| WO | 2006081558 A2 | 8/2006 |
| WO | 2007133710 A2 | 11/2007 |

OTHER PUBLICATIONS

Response to Office Action dated Oct. 14, 2009 from co-pending U.S. Appl. No. 11/343,284.
Office Action dated Jan. 27, 2010 from co-pending U.S. Appl. No. 11/343,284.
Response to Office Action dated Jan. 29, 2010 from co-pending U.S. Appl. No. 11/343,284.
Response to Office Action dated Jan. 28, 2011 from co-pending U.S. Appl. No. 11/343,284.
Office Action dated Jan. 25, 2011 from co-pending U.S. Appl. No. 11/343,284.
Office Action dated Jun. 9, 2011 from co-pending U.S. Appl. No. 11/343,284.
Pollack et al., "Electrowetting-Based Actuation of Droplets for Integrated Microfluidics," Lab on a Chip (LOC), vol. 2, pp. 96-101, 2002.
Pollack et al., "Investigation of electrowetting-based microfluidics for real-time PCR applications," 7th Int'l Conference on Micro Total Analysis Systems (µTAS), pp. 1-4, 2003.
Shen et al., "A microchip-based PCR device using flexible printed circuit technology," Sensors and Actuators, vol. 105, pp. 251-258, 2005.
Wang et al., "Droplet-based micro oscillating-flow PCR chip," J. Micromechanics and Microengineering, vol. 15, pp. 1369-1377, 2005.
Zhang et al., K. Chakrabarty, R.B. Fair, "Behavioral modeling and performance evaluation of microelectrofluidics-based PCR systems using SystemC", IEEE Transactions on Computer-Aided Design of Integrated Circuits & Systems, vol. 23 (6): pp. 843-858, Jun. 2004.
Zou et al., "Micro-assembled multi-chamber thermal cycler for low-cost reaction chip thermal multiplexing," Sensors and Actuators, vol. 102, pp. 114-121, 2002.
Torkkeli, Atti "Droplet microfluidics on a planar surface," Doctoral Dissertation, Department of Electrical Engineering, Helsinki University of Technology (Oct. 3, 2003).
Verpoorte, E. "Beads and chips: new recipes for analysis," Lab on a Chip (LOC), vol. 3, pp. 60N-68N, 2003.
Aldrich et al., "PathoFinder: Microscale PCR Based Virus Detection," Yale Department of Engineering Design Course Report, Dec. 2003.
Berge, F., "Electrocapillarity & wetting of insulator films by water," C. R. Acad. Sci. Paris, 317(11), pp. 157-163, 1993.
Bertsch et al., "3D Micromixers—Downscaling Large Scale Industrial Static Mixers", IEEE, pp. 507-510, 2001.
Branebjerg et al., "Fast mixing by lamination", in Proc. of the 9th IEEE Micro Electro Mechanical Systems Workshop, eds. M. G. Allen and M. L. Reed (San Diego, Calif.) pp. 441-446, 1996.
Burns et al., "An Integrated Nanoliter DNA Analysis Device", Science, vol. 282, pp. 484-487, 1998.
Cho et al., "Concentration and binary separation of micro particles for droplet-based digital microfluidics," Lab Chip, vol. 7, pp. 490-498, 2007.
Cho et al., Proceedings of 2001 ASME International Mechanical Engineering Congress and Exposition, Nov. 2001, pp. 1-7.
Choi et al., "An Active Micro Mixer Using Electrohdrodynamic (EHD) Convection", Technical Digest of Solid-State Sensor and Actuator Workshop, Hilton Head Island, SC, pp. 52-55, 2000.
deRuijter et al., "Droplet Spreading: Partial Wetting Regime Revisited", Langmuir, vol. 15, pp. 2209-2216, 1999.
Ding et al., "Reconfigurable Microfluidic System Architecture Based on Two-Dimensional Electrowetting Arrays," Proc. International Conference on Modeling and Simulation of Microsystems (Mar. 19-21, 2001), pp. 181-185.
Dussan, E.B., "Immiscible Liquid Displacement in a Capillary Tube: The Moving Contact Line", AIChe Journal, vol. 23, No. 1, pp. 131-133, Jan. 1977.
Dussan, E.B., "On the Spreading of Liquids on Solid Surfaces: Static and Dynamic Contact Lines", Ann. Rev. Fluid Mech., vol. 11, pp. 371-400, 1979.
Evans et al., "Planar Laminar Mixer", Proceeding of the IEEE 10th Annual Workshop of MEMS (MEMS '97), Nagoya, Japan, pp. 96-101, Jan. 1997.
Fair et al., "Bead-Based and Solution-Based Assays Performed on a Digital Microfluidic Platform," Biomedical Engineering Society (BMES) Fall Meeting, Baltimore, MD, Oct. 1, 2005.
Fair et al., "Chemical and Biological Applications of Digital Microfluidic Devices", IEEE Design and Test of Computers, vol. 24(1): pp. 10-24 Jan.-Feb. 2007.
Fowler et al., "Enhancement of Mixing by Droplet-Based Microfluidics", IEEE, pp. 97-100, 2002.
Hosokawa et al., "Droplet-Based Nano/Picoliter Mixer using Hydrophobic Microcapillary Vent", Twelfth IEEE International Conference on Micro Electro Mechanical Systems, IEEE, pp. 388-393, Jan. 1999.
Hosokawa et al., "Handling of Picoliter Liquid Samples in a Poly (dimethysiloxane)-Based Microfluidic Device", Anal. Chem., vol. 71, pp. 4781-4785, 1999.
Huh et al., "Hydrodynamic Model of Steady Movement of a Solid/Liquid/Fluid Contact Line", Journal of Colloid and Interface Science, vol. 35, No. 1, pp. 85-101, Jan. 1971.
Jones, T.B. et al., "Dielectrophoretic liquid actuation and nanodroplet formation," J. Appl. Phys., vol. 89, No. 2, pp. 1441-1448 (Jan. 2001).
Kim, Chang-Jin, "Micropumping by electrowetting", Proceedings of the 2001 ASME International Mechanical Engeering Congress & Exposition, Interlaken, Switzerland, Nov. 11-16, 2001.
Koch et al., "Two Simple Micromixers Based on Silicon", J. Micromech. Microeng. vol. 8, pp. 123-126, Jun. 1998.
Koch et al., "Micromachined Chemical Reaction System", Elsevier, Sensors and Actuators, vol. 74, pp. 207-210, 1999.
Koch et al., "Improved Characterization Technique for Micromixers", J. Micromech.Microeng. vol. 9, pp. 156-158, 1998.
Krog et al., "Experiments and Simulations on a Micro-Mixer Fabricated using a Planar Silicon/Glass Technology", Microelectromechanical Systems (MEMS) DSC-vol. 59, ASME, pp. 177-182, 1996.
Lee et al., "Microactuation by Continuous Electrowetting Phenomenon and Silicon Deep Rie Process", Proc. MEMS (DSC—vol. 66) ASME Int. Mechanical Engineering Congress and Exposition, Anaheim, CA, Nov. 1998, pp. 475-480.
Lee et al., "Chaotic Mixing in Electrokinetically and Pressure Driven Micro Flows", Rhw 14.sup.th IEEE Workshop on MEMS, Jan. 2001.
Lee al., Addressable micro liquid handling by electric control of surface tension. Proceedings IEEE Conference on Micro Electro Mechanical Systems (MEMS 2001) Interlaken, Switzerland, Jan. 2001, pp. 499-502.
Lee, Jung-Hoon, dissertation, Microactuation by continuous electrowetting and electroweeting: theory, fabrication and demonstration, UCLA 2000.
Lehmann et al., "Droplet-Based DNA Purification in a Magnetic Lab-on-a-Chip," Angewandte Chemie, vol. 45, pp. 3062-3067, 2006.
Liu et al., "Passive Mixing in a Three Dimensional Serpentine Microchannel", Journal of Microelectromechanical Systems, vol. 9, No. 2, pp. 190-197, 2000.
Miyake et al., "Micro Mixer with Fast Diffusion", IEEE, pp. 248253, 1993.
Moesner et al., Devices for particle handling by an AC electric field. Proceedings IEEE Micro Electro Mechanical Systems, Amsterdam, Jan. 1995. UCLA 2000.
Mugele et al., "Electrowetting: from basics to applications," Journal of Physics: Condensed Matter, 17, pp. R705-R774 (Jul. 2005).
Pamula et al., "Microfluidic electrowetting-based droplet mixing," IEEE, 2002, pp. 8-10.
Pamula et al. Microfluidic electrowetting-basd droplet mixing. Proceedings, MEMS Conference Berkeley, Aug. 2001; pp. 8-10.
Pamme, N., "Magnetism and microfluidics," Lab on a Chip (LOC), vol. 6, pp. 24-38, 2006.
N. Pamme, "Magnetism and microfluidics," Lab on a Chip (LOC), vol. 6, pp. 24-38, 2006.
Pollack, M., "Electrowetting-based Microactuation of Droplets for Digital Microfluidics", PhD Thesis, Department of Electrical and Computer Engineering, Duke University, 2001.
Saeki et al, "Electrowetting on Dielectrics (EWOD): Reducing Voltage Requirements for Microfluidics", Polymeric Materials: Sci. Engr., vol. 85, pp. 12-13, 2001.

Schwesinger et al., "A Modular Microfluid System with an Integrated Micromixer", J. Micromech.Microeng. vol. 6, IOP Publishing Ltd., pp. 99-102, Mar. 1996.

Veenstra et al., "Characterization method for a new diffusion mixer applicable in micro flow injection analysis systems", Journal of Micromechanics and Microengineering, 9, (2), pp. 199-202, 1999.

Vinet, F. et al., "Microarrays and microfluidic devices; miniaturized systems for biological analysis," Microelectronic Engineering 61-62 (2002) 41-47.

Vivek et al., "Novel Acoustic-Wave Micromixer," IEEE International Micro Electro Mechanical Systems Conference, Miyazaki, Japan, pp. 668-673, Jan. 23-27, 2000.

Voldman, "An Integrated Liquid Mixer/Valve", Journal of Microelectromechanical Systems, vol. 9, No. 3, pp. 295-302, Sep. 2000.

Lee et al., "Surface-tension-driven microactuation based on continuous electrowetting," Journal of Microelectromechanical Systems, vol. 9 (2): pp. 171-180, Jun. 2000.

Chang et al., "Low Cost RF MEMS Switches Fabricated on Microwave Laminate Printed Circuit Boards," Department of Electrical and Computer Engineering, University of California at Irvine, Irvine, CA, 92697, USA Integrated Nanosystems Research Facility, University of California at Irvine, Irvine, CA, 92697, pp. 1-4, Apr. 2003.

Chaterjee, Debalina, "Lab on a Chip Applications with a Digital Microfluidic Platform," UCLA Dissertation 2008, UMI Microform No. 3342975.

Gong et al., Declaration Under 37 CFR 1.131, filed in the USPTO Aug. 20, 2010 in U.S. Appl. No. 11/460,188, filed Jul. 26, 2006, entitled "Small Object Moving on Printed Circuit Board".

Weaver, Nicole, "Application of Magnetic Microspheres for Pyrosequencing on a Digital Microfluidic Platform," web publication, Aug. 29, 2005.

Cheuk-Wing et al., Development of PDMS-based Microfluid Device for Cell-based Assays; Applied Research Centre for Genomic Technology, and Department of Biology and Chemistry, Chemical Journal of Chinese Universities, vol. 25, Apr. 2004, Suppl. pp. 4-6.

Ding, Jie, "System level architectural optimization of semi-reconfigurable microfluidic system," M.S. Thesis, Duke University Dept of Electrical Engineering, 2000.

Li et al., "PDMS-based microfluidic device with multi-height structures fabricated by single-step photolithography using printed circuit board as masters," Analyst, vol. 128, No. 9, pp. 1137-1142 (2003).

Moon, Hyejin, Ph.D., "Electrowetting-on-dielectric microfluidics: Modeling, physics, and MALDI application," University of California, Los Angeles, 2005, 122 Pages.

Schwartz, J.A., "Dielectrophoretic Approaches to Sample Preparation and Analysis," The University of Texas, Dissertation, Dec. 2001.

Scwartz et al., "Droplet-based chemistry on a programmable microchip," Lab on a Chip, vol. 4, No. 1, pp. 11-17 (2002).

Tan et al., "Design of microfluidic channel geometries for the control of droplet volume, chemical concentration, and sorting," Lab on a Chip, vol. 4, No. 4, pp. 292-298 (2004).

Tice et al., "Effects of viscosity on droplet formation and mixing in microfluidic channels," Analytica Chimica Acta, vol. 507, pp. 73-77 (2004).

Unger et al., "Monolithic Microfabricated Valves and Pumps by Multilayer Soft Lithography," Science, vol. 288, pp. 113-116 (2000).

Paik et al., "Coplanar Digital Microfluidics Using Standard Printed Circuit Board Processes," 9th International Conference on Miniaturized Systems for Chemistry and Lice Sciences (MicroTAS) POSTER, Oct. 2005.

Cheuk-Wing et al., Development of PDMS-based Microfluid Device for Cell-based Assays; Applied Research Centre for Genomic Technology, and Department of Biology and Chemistry, Chemical Journal of Chinese Universities, vol. 25, 2004, pp. 4-6.

Gong et al., "Two-Dimensional Digital Microfluidic System by Multi-Layer Printed Circuit Board," IEEE, pp. 726-729, 2005.

Paik et al., "Thermal Effects on Droplet Transport in Digital Microfluidics with Applications to Chip Cooling," 2004 Inter Society Conference on Thermal Phenomena, pp. 649-654.

Office Action dated Dec. 26, 2008 from U.S. Appl. No. 11/753,318.
Response to Office Action dated Jan. 26, 2009 from U.S. Appl. No. 11/753,318.
Office Action dated May 1, 2009 from U.S. Appl. No. 11/753,318.
Response to Office Action dated May 11, 2009 from U.S. Appl. No. 11/753,318.
Office Action dated Sep. 9, 2009 from U.S. Appl. No. 11/753,318.
Response to Office Action dated Nov. 25, 2009 from U.S. Appl. No. 11/753,318.
Office Action dated May 25, 2010 from U.S. Appl. No. 11/753,318.
Office Action dated Sep. 21, 2010 U.S. Appl. No. 11/753,318.
Response to Office Action dated Nov. 30, 2010 from U.S. Appl. No. 11/753,318.
Office Action dated Mar. 29, 2011 from U.S. Appl. No. 11/753,318.
Response to Office Action dated Apr. 21, 2011 from U.S. Appl. No. 11/753,318.
Office Action dated Aug. 20, 2010 from U.S. Appl. No. 12/576,794.
Response to Office Action dated Nov. 4, 2010 from U.S. Appl. No. 12/576,794.
Office Action dated Dec. 23, 2010 from U.S. Appl. No. 12/576,794.
Response to Office Action dated Jan. 17, 2011 from U.S. Appl. No. 12/576,794.
Office Action dated Feb. 9, 2011 from U.S. Appl. No. 12/576,794.
Response to Office Action dated Apr. 7, 2011 from U.S. Appl. No. 12/576,794.
Office Action dated Apr. 28, 2011 from U.S. Appl. No. 12/576,794.

Fan et al., "EWOD Driving of Droplet on NxM Grid Using Single-Layer Electrode Patterns," Solid-State Sensor, Actuator and Microsystems Workshop, Hilton Head Island, South Carolina, pp. 134-137, Jun. 2-6, 2002.

Armani et al., "Control of Microfluidic Systems: Two Examples, Results, and Challenges," International Journal of Robust and Nonlinear Control, vol. 15, Issue 16, pp. 785-803, Sep. 15, 2005.

Wego et al., "Fluidic Microsystems Based on Printed Circuit Board Technology," J. Micromech, Microeng. vol. 11, No. 5, pp. 528-531 (Sep. 2001).

Wego et al., "Investigations on Thermo-Pneumatic Volume Acutuators Based on PCB Technology," Sensors and Actuators A 93, pp. 95-102 (2001).

Cho et al., "Towards Digital Microfluidic Circuits: Creating, Transporting, Cutting and Merging Liquid Droplets by Electrowetting-Based Actuation," Proc. IEEE/Micro Electro Mechanical Systems Conference, pp. 32-35, 2002.

Wheeler et al., "Electrowetting-on-dielectric for analysis of peptides and proteins by matrix assisted laser desorption/ionization mass spectrometry," Solid-State Sensor, Actuator and Microsystems Workshop publication, pp. 402-403, Jun. 6-10, 2004.

Yi et al., "Geometric surface modification of nozzles for complete transfer of liquid drops," Solid-State Sensor, Actuator and Microsystems Workshop, pp. 164-167, Jun. 6-10, 2004.

Pipper et al., "Clockwork PCR Including Sample Preparation," Angew. Chem. Int. Ed., vol. 47, pp. 3900-3904, 2008.

Raccurt et al., "On the influence of surfactants in electrowetting systems," J. Micromech. Microeng., vol. 17, pp. 2217-2223 (2007).

Roux and Fouillet, "3D droplet displacement in microfluidic systems by electrostatic actuation," Sensors and Actuators A, vol. 134, Issue 2, pp. 486-493, Mar. 15, 2007.

Wheeler, "Putting Electrowetting to Work," Science, vol. 322, No. 5901, pp. 539-540, Oct. 24, 2008.

Cooney et al., "isothermal DNA Amplification Reaction on an Electrowetting Microchip," Keck Graduate Institute online poster publication (http://microfluidics.kgi.edu/publications/ACS-sandiego-poster-2004.pdf), 2004.

Poliski, Iris, "Making materials fit the future: accommodating relentless technological requirements means researchers must recreate and reconfigure materials, frequently challenging established laws of physics, while keeping an eye on Moore's law", R&D Magazine, Dec. 2001.

Pollack et al., Proceedings of Utas 2003-Seventh International Conference on Micro Total Analysis Systems: pp. 619-622 (2003).

PCT International Preliminary Report on Patentability for PCT/US2006/003230 dated Sep. 25, 2007.

PCT International Search Report and Written Opinion for PCT/US2006/003230 dated Aug. 29, 2007.

European Search Report for EP 06734056.2 dated Jan. 28, 2008.

Gong et al., "Portable digital microfluidics platform with active but disposable Lab-On-Chip," Micro Electro Mechanical Systems, 17th IEEE International Conference on (MEMS), Maastricht, Netherlands, Jan. 25-29, 2004; Piscataway, NJ, IEEE, Jan. 25, 2004, pp. 355-358.

Yamaguchi et al., "High-Throughput Method for N-Terminal Sequencing of Proteins by MALDI Mass Spectrometry," Analytical Chemistry, vol. 77, No. 2, pp. 645-651 (Jan. 15, 2005).

Seyrat et al "Amorphous fluoropolymers as insulators for reversible low-voltage electrowetting," Journal of Applied Physics, vol. 90 (3): pp. 1383-1386, Aug. 1, 2001.

Washizu, "Electrostatic Actuation of Liquid Droplets for Micro-Reactor Applications", IEEE Industry Applications Society Annual Meeting, pp. 1867-1873, Oct. 5-9, 1997.

Pagel et al., "A self-filling micropump based on PCB technology," Sensors and Actuators A-Physical, vol. 88, No. 3, pp. 220-226 (Mar. 5, 2001).

Wheeler et al., "Digital microfluidics with in-line sample purification for proteomics analyses with MALDI-MS," Analytical Chemistry, vol. 77, No. 2, pp. 534-540 (Jan. 15, 2005).

"Chip mixes droplets faster", MIT Technology Review, Oct. 2003.

"Chip Juggles Droplets", Technology Research News, Sep. 4-11, 2002.

"Laboratory on a Chip", Popular Mechanics, Mar. 2002.

"Lab-on-a-Chip Technology May Present New ESD Challenges", Electrostatic Discharge Journal, Mar. 2002.

"Making materials fit the future: accommodating relentless technological requirements means researchers must recreate and reconfigure materials, frequently challenging established laws of physics, while keeping an eye on Moore's law", R&D Magazine, Dec. 2001.

Agah, Ali, "DNA Analysis Chip by Electrowetting Actuation," Stanford Nanofabrication Facility, p. 9, 2002.

Altomare et al., "Levitation and Movement of Human Tumor Cells Using a Printed Circuit Board Device Based on Software-Controlled Dielectrophoresis", Biotechnology and Bioengineering, vol. 82, pp. 474-479 (2003).

Berge et al., "Variable focal lens controlled by an external voltage: An application of electrowetting," The European Physical Journal E, vol. 3, pp. 159-163 (2000).

Bhansali et al., "Resolving chemical/bio-compatibility issues in microfluidic MEMS systems," SPIE Conference on Microfluidic Devices and Systems II, vol. 3877, Santa Clara, CA, pp. 101-109 (1999).

Dewey et al., "Visual modeling and design of microelectromechanical system transducers", Microelectronics Journal, vol. 32, pp. 373-381, Apr. 2001.

Dewey et al., "Towards a visual modeling approach to designing micro electromechanical system transducers," Journal of Micromechanics and Microengineering, vol. 9, pp. 332-340, Dec. 1999.

Fair et al., "Integrated chemical/biochemical sample collection, pre-concentration, and analysis on a digital microfluidic lab-on-a-chip platform," Lab-on-a-Chip: Platforms, Devices, and Applications, Conf. 5591, SPIE Optics East, Philadelphia, Oct. 25-28, 2004.

Huang et al., "MEMS-based sample preparation for molecular diagnostics", Analytical and Bioanalytical Chemistry, vol. 372, pp. 49-65 (2002).

Jobst et al., "Mass producible miniaturized flow through a device with a biosensor array," Sensors and Actuators B-Chemical, vol. 43, pp. 121-125 (Sep. 1997).

Laritz et al., "A microfluidic pH-regulation system based on printed circuit board technology," Sensors and Actuators A-Physical, vol. 84, No. 3, pp. 230-235 (Sep. 1, 2000).

Medoro et al., "A Lab-on-a-Chip for Cell Detection and Manipulation", IEEE Sensors Journal, vol. 3, pp. 317-325 (2003).

Merkel et al., "Electric fields in fluidic channels and sensor applications with capacitance," Sensors and Actuators A, vol. 80, pp. 1-7 Mar. 1, 2000.

Merkel et al, "A new technology for fluidic microsystems based on PCB technology," Sensors and Actuators A-Physical, vol. 77, No. 2, pp. 98-105 (Oct. 12, 1999).

Nguyen et al. "Miniature valveless pumps based on printed circuit board technique," Sensors and Actuators A-Physical, vol. 88, No. 2, pp. 104-111 (Feb. 15, 2001).

Paik et al., Coplanar Digital Microfluidics Using Standard Printed Circuit Board Processes, 9th International Conference on Miniaturized Systems for Chemistry and Lice Sciences (MicroTAS), pp. 566-568, Oct. 2005.

Paik et al., "Electrowetting-based droplet mixers for microfluidic systems", Lab on a Chip (LOC), vol. 3, pp. 28-33, 2003.

Paik et al., "Rapid droplet mixers for digital microfluidic systems," Lab on a Chip (LOC), vol. 3, pp. 253-259, 2003.

Pamula et al., "A droplet-based lab-on-a-chip for colorimetric detection of nitroaromatic explosives," Proceedings of Micro Electro Mechanical Systems, pp. 722-725, 2005.

Pamula et al., "Cooling of integrated circuits using droplet-based microfluidics," Proc. ACM Great Lakes Symposium on VLSI, pp. 84-87, Apr. 2003.

Pollack et al., "Electrowetting-based actuation of liquid droplets for microfluidic applications," Appl. Phys. Letters, vol. 77, No. 1 (Sep. 11, 2000), pp. 1725-1726.

Pollack et al., "Electrowetting-Based Microfluidics for High-Throughput Screening," smallTalk2001 Conference Program Abstract (Aug. 2001), p. 149, San Diego.

Prins et al., "Fluid Control in Multichannel Structures by Electrocapillary Pressure," SCIENCE vol. 291, pp. 277-280, Jan. 12, 2001.

Ren et al., "Automated electrowetting-based droplet dispensing with good reproducibility," Proc. Micro Total Analysis Systems (mTAS), pp. 993-996, 2003.

Ren et al., "Design and testing of an interpolating mixing architecture for electrowetting-based droplet-on-chip chemical dilution", Transducers 2003, pp. 619-622, 2003.

Srinivasan et al., "A digital microfluidic biosensor for multianalyte detection", Proc. IEEE 16th Micro Electro Mechanical Systems Conference, pp. 327-330, 2003.

Srinivasan et al., "An integrated digital microfluidic lab-on-a-chip for clinical diagnostics on human physiological fluids," Lab on a Chip (LOC), vol. 4, pp. 310-315, 2004.

Srinivasan et al., "Clinical diagnostics on human whole blood, plasma, serum, urine, saliva, sweat, and tears on a digital microfluidic platform," Proc. Micro Total Analysis Systems (mTAS), pp. 1287-1290, 2003.

Srinivasan et al., "Droplet-based microfluidic lab-on-a-chip for glucose detection," Analytica Chimica Acta, vol. 507, No. 1, pp. 145-150, 2004.

Srinivasan et al., "Protein Stamping for MALDI Mass Spectrometry Using an Electrowetting-based Microfluidic Platform," Lab-on-a-Chip: Platforms, Devices, and Applications, Conf. 5591, SPIE Optics East, Philadelphia, Oct. 25-28, 2004.

Srinivasan et al, "Scalable Macromodels for Microelectromechanical Systems," Technical Proc. 2001 Int. Conf. on Modeling and Simulation of Microsystems, pp. 72-75, 2001.

Srinivasan et al., "3-D imaging of moving droplets for microfluidics using optical coherence tomography," Proc. Micro Total Analysis Systems (mTAS), pp. 1303-1306, 2003.

Su et al., "Testing of droplet-based microelectrofluidic systems", Proc. IEEE International Test Conference, pp. 1192-1200, 2003.

Sudarsan et al., "Printed circuit technology for fabrication of plastic based microfluidic devices," Analytical Chemistry vol. 76, No. 11, pp. 3229-3235 (Jun. 1, 2004).

Taniguchi et al., "Chemical reactions in microdroplets by electrostatic manipulation of droplets in liquid media," Lab on a Chip, vol. 2, No. 2, pp. 19-23 (2002).

PCB DROPLET ACTUATOR FABRICATION

1 RELATED APPLICATIONS

In addition to the patent applications cited herein, each of which is incorporated herein by reference, this patent application is related to and claims priority to U.S. Provisional Patent Application No. 60/954,841, filed on Aug. 9, 2007, entitled "PCB Droplet Actuator Fabrication," the entire disclosure of which is incorporated herein by reference.

2 FIELD OF THE INVENTION

The present invention generally relates to the field of conducting droplet operations in a droplet actuator. In particular, the present invention is directed to alternative approaches to fabricating printed circuit boards for use in droplet actuator operations.

3 BACKGROUND OF THE INVENTION

Droplet actuators are used to conduct a wide variety of droplet operations. A droplet actuator typically includes two plates separated by a gap. The plates include electrodes for conducting droplet operations. The space is typically filled with a filler fluid that is immiscible with the fluid that is to be manipulated on the droplet actuator. The formation and movement of droplets is controlled by electrodes for conducting a variety of droplet operations, such as droplet transport and droplet dispensing. One or both of the plates of the droplet actuator may be manufactured using a printed circuit board ("PCB"). As the functionality of the droplet actuator is dependent on, for example, the surface smoothness, topology, planarity, and florescence of the PCB layers that form the gap, there is a need for alternative approaches to fabricating PCBs to provide PCB droplet actuators with more desirable characteristics.

4 BRIEF DESCRIPTION OF THE INVENTION

The present invention is directed to alternative approaches to fabricating printed circuit boards for use in droplet actuator operations.

In one embodiment, a method of manufacturing a droplet actuator for conducting droplet operations is provided. The method comprises positioning a dielectric material between a first metal layer configured to include an electrode and a second metal layer configured to include an interconnect pad. The method additionally comprises forming a connection between the first and second metal layers.

In another embodiment, a droplet actuator for conducting droplet operations is provided. The droplet actuator comprises a first plate that includes a first metal layer comprising an electrode, a second metal layer comprising an interconnect pad, a dielectric material positioned between the first and second metal layers, and a via connecting the electrode to the interconnect. The droplet actuator additionally comprises a second plate proximate the first plate and forming a gap therebetween that provides a fluid flow path for the droplet operations.

In a further embodiment, a method of fabricating and supporting a printed circuit board of a droplet actuator for conducting droplet operations is provided. The method comprises providing a core printed circuit board by positioning a dielectric material between a first metal layer configured to include an electrode and a second metal layer configured to include an interconnect pad, applying a photoresist layer onto the first metal layer and forming one or more openings in the dielectric material and the second metal layer, applying a photoresist layer onto the second metal layer and plating the one or more openings to form one or more blind vias, thereby forming a connection between the first and second metal layers. The method further comprises stripping the photoresist layer from both the first metal layer and the second metal layer, patterning the features on both the first metal layer and the second metal layer, applying an electrowetting dielectric layer to the first metal layer, and bonding a rigid support structure to the second metal layer.

5 DEFINITIONS

As used herein, the following terms have the meanings indicated.

"Activate" with reference to one or more electrodes means effecting a change in the electrical state of the one or more electrodes which results in a droplet operation.

"Droplet" means a volume of liquid on a droplet actuator that is at least partially bounded by filler fluid. For example, a droplet may be completely surrounded by filler fluid or may be bounded by filler fluid and one or more surfaces of the droplet actuator. Droplets may take a wide variety of shapes; nonlimiting examples include generally disc shaped, slug shaped, truncated sphere, ellipsoid, spherical, partially compressed sphere, hemispherical, ovoid, cylindrical, and various shapes formed during droplet operations, such as merging or splitting or formed as a result of contact of such shapes with one or more surfaces of a droplet actuator.

"Droplet operation" means any manipulation of a droplet on a droplet actuator. A droplet operation may, for example, include: loading a droplet into the droplet actuator; dispensing one or more droplets from a source droplet; splitting, separating or dividing a droplet into two or more droplets; transporting a droplet from one location to another in any direction; merging or combining two or more droplets into a single droplet; diluting a droplet; mixing a droplet; agitating a droplet; deforming a droplet; retaining a droplet in position; incubating a droplet; heating a droplet; vaporizing a droplet; cooling a droplet; disposing of a droplet; transporting a droplet out of a droplet actuator; other droplet operations described herein; and/or any combination of the foregoing. The terms "merge," "merging," "combine," "combining" and the like are used to describe the creation of one droplet from two or more droplets. It should be understood that when such a term is used in reference to two or more droplets, any combination of droplet operations that are sufficient to result in the combination of the two or more droplets into one droplet may be used. For example, "merging droplet A with droplet B," can be achieved by transporting droplet A into contact with a stationary droplet B, transporting droplet B into contact with a stationary droplet A, or transporting droplets A and B into contact with each other. The terms "splitting," "separating" and "dividing" are not intended to imply any particular outcome with respect to size of the resulting droplets (i.e., the size of the resulting droplets can be the same or different) or number of resulting droplets (the number of resulting droplets may be 2, 3, 4, 5 or more). The term "mixing" refers to droplet operations which result in more homogenous distribution of one or more components within a droplet. Examples of "loading" droplet operations include microdialysis loading, pressure assisted loading, robotic loading, passive loading, and pipette loading.

The terms "top" and "bottom" are used throughout the description with reference to the top and bottom substrates of the droplet actuator for convenience only, since the droplet actuator is functional regardless of its position in space.

When a given component, such as a layer, region or substrate, is referred to herein as being disposed or formed "on" another component, that given component can be directly on the other component or, alternatively, intervening components (for example, one or more coatings, layers, interlayers, electrodes or contacts) can also be present. It will be further understood that the terms "disposed on" and "formed on" are used interchangeably to describe how a given component is positioned or situated in relation to another component. Hence, the terms "disposed on" and "formed on" are not intended to introduce any limitations relating to particular methods of material transport, deposition, or fabrication.

When a liquid in any form (e.g., a droplet or a continuous body, whether moving or stationary) is described as being "on", "at", or "over" an electrode, array, matrix or surface, such liquid could be either in direct contact with the electrode/array/matrix/surface, or could be in contact with one or more layers or films that are interposed between the liquid and the electrode/array/matrix/surface.

When a droplet is described as being "on" or "loaded on" a droplet actuator, it should be understood that the droplet is arranged on the droplet actuator in a manner which facilitates using the droplet actuator to conduct droplet operations on the droplet, the droplet is arranged on the droplet actuator in a manner which facilitates sensing of a property of or a signal from the droplet, and/or the droplet has been subjected to a droplet operation on the droplet actuator.

7 DETAILED DESCRIPTION OF THE INVENTION

The invention provides an improved PCB fabrication process for forming a PCB for a droplet actuator that has certain characteristics and properties for ensuring a desired functionality thereof. In particular, the PCB fabrication process of the invention provides PCB layers that have, for example, but not limited to, a certain surface smoothness, topology, planarity, and low florescence that are suited to ensure a desired functionality in the electrowetting process, which is used for performing droplet operations. Additionally, the invention provides a nonlimiting example of a droplet actuator that is formed by the improved PCB fabrication process of the invention.

7.1 PCB Fabrication Process for Forming Droplet Actuators

Figure 1:
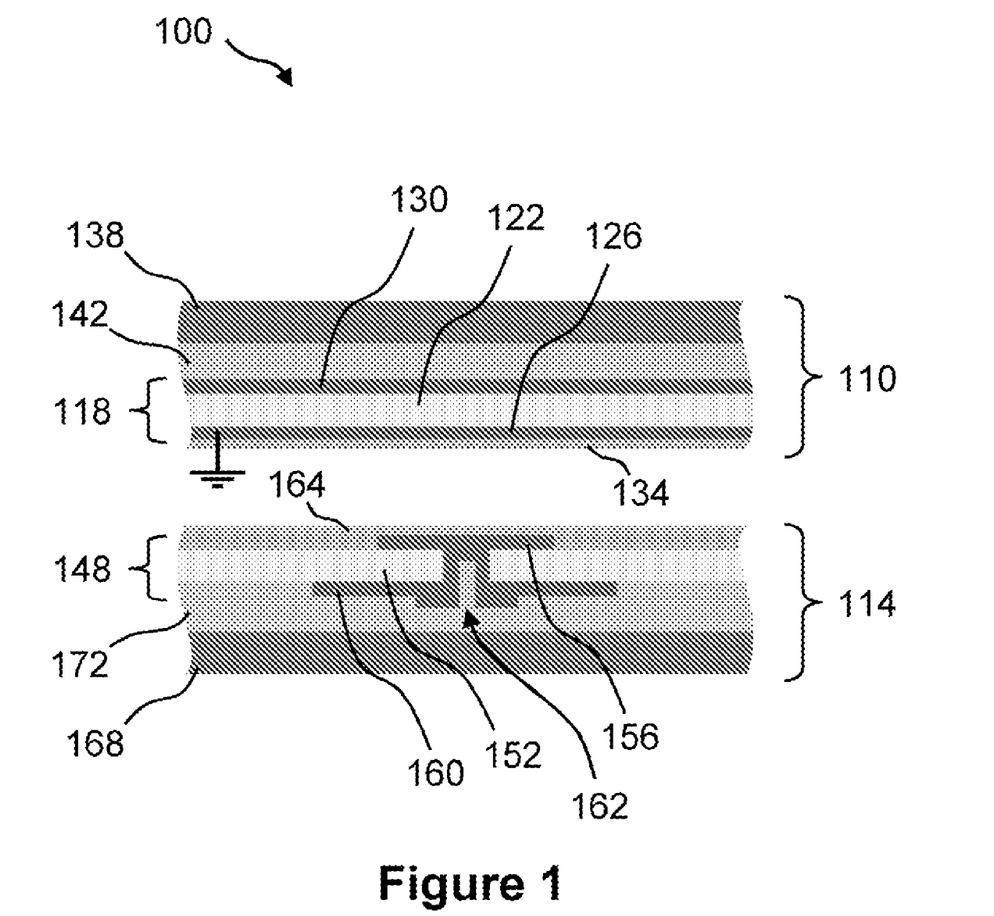
FIG. 1 illustrates a side view of a portion of an example droplet actuator formed by a PCB fabrication process described in accordance with the present invention.

FIG. 1 illustrates a side view of a portion of a droplet actuator 100, which is a nonlimiting example of a droplet actuator that is formed by the improved PCB fabrication process of the invention. Droplet actuator 100 includes a first plate, such as a top plate 110, and a second plate, such as a bottom plate 114.

Top plate 110 may be formed of a core PCB 118 that is formed of a core dielectric layer 122 that is sandwiched between a first metal layer 126 and a second metal layer 130. One side of core PCB 118 of top plate 110 is coated with an electrowetting dielectric layer 134. The opposite side of core PCB 118 is laminated to a rigid support structure 138 by use of a bonding layer 142.

Bottom plate 114 may be formed of a core PCB 148 that is formed of a core dielectric layer 152 that is sandwiched between a first metal layer within which is formed one or more electrodes 156 and a second metal layer within which is formed one or more interconnect pads 160. Additionally, each electrode 156 of core PCB 148 may be electrically connected to a respective interconnect pad 160 by use of a via structure 162 that is commonly known as a "blind via," "hidden via," or "micro-via" structure. One side of core PCB 148 of bottom plate 114 is coated with an electrowetting dielectric layer 164. The opposite side of core PCB 148 is laminated to a rigid support structure 168 by use of a bonding layer 172.

Top plate 110 and bottom plate 114 are arranged one to another such that there is a gap therebetween that provides a fluid flow path for conducting droplet operations. In particular, first metal layer 126 of top plate 110 that is coated with electrowetting dielectric layer 134 is oriented toward the gap and, thus, acts as the ground electrode. Additionally, the one or more electrodes 156 of bottom plate 114 that are coated with electrowetting dielectric layer 164 are oriented toward the gap and, thus, may act as transport electrodes.

A droplet actuator, such as droplet actuator 100, that is formed by the improved PCB fabrication process of the invention, has a certain desired surface smoothness, surface topology, surface planarity, and low florescence. By way of example, more details of the materials and the step-by-step fabrication of a bottom plate, such as bottom plate 114, by use of the improved PCB fabrication process of the invention are found with reference to FIGS. 2 through 7.

Figure 2:
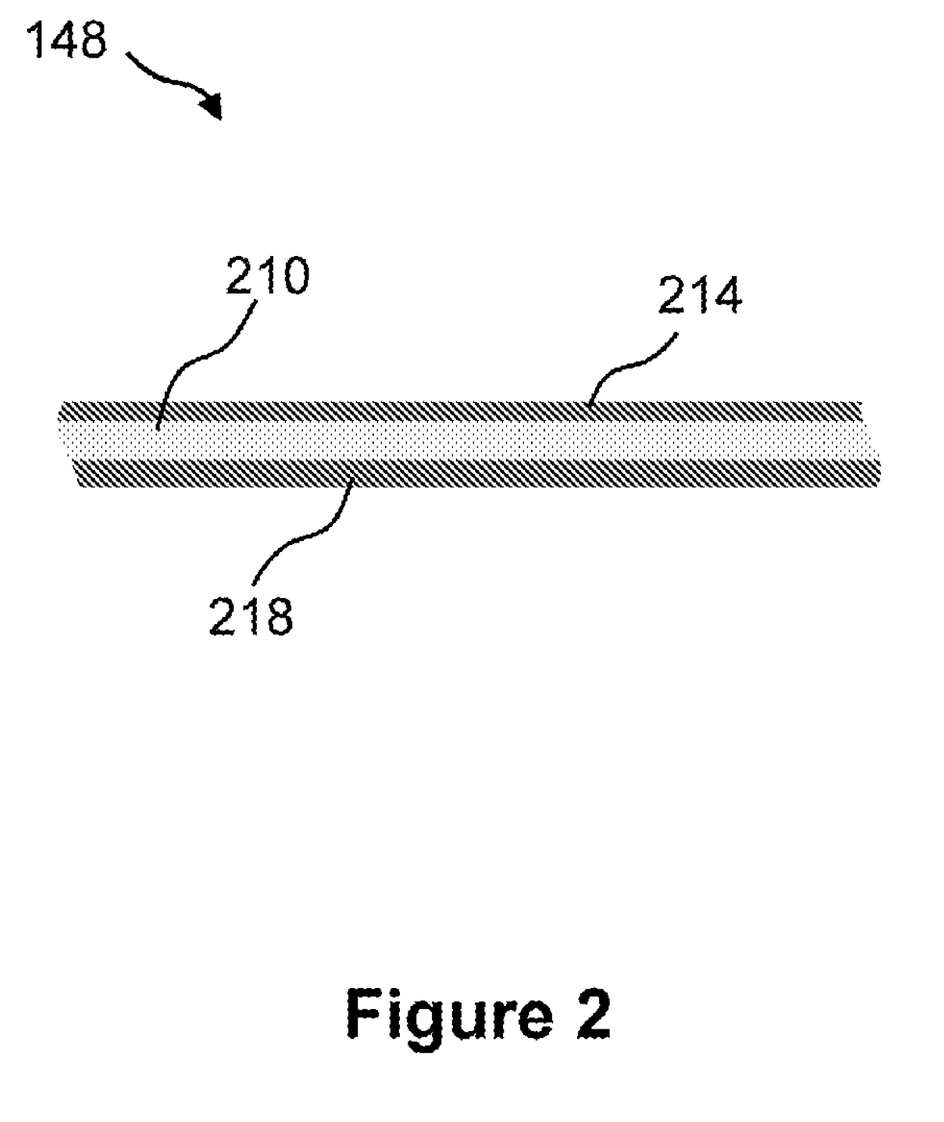
FIG. 2 illustrates an example of a first process step of fabricating a bottom plate of a droplet actuator by providing a core PCB that is formed of a core dielectric layer that has metal layers on both sides, e.g., an electrode side metal layer and a non-electrode side metal layer.

FIG. 2 illustrates a nonlimiting example of a first process step of fabricating a bottom plate of a droplet actuator, such as bottom plate 114 of droplet actuator 100 of FIG. 1, by use of the improved PCB fabrication process of the invention. More specifically, a first step may include the acquisition of core PCB 148 that includes a core dielectric layer 210 that is sandwiched between a first metal layer 214 and a second metal layer 218. In one example, core PCB 148 may be acquired commercially in an assembled form, i.e., first metal layer 214 and second metal layer 218 that is bonded already to core dielectric layer 210 in an unpatterned and unprocessed state. In another example, core dielectric layer 210 may be formed of a commercially available dielectric material, such as Kapton®; liquid crystal polymer (LCP); standard FR4, which is general purpose epoxy/fiberglass woven material; and any polymer (e.g., Mylar®). Additionally, the thickness of core dielectric layer 210 is selected to permit droplet operations and in some cases may be up to about 50 microns. See section 7.2 "Fabrication Materials" for examples of materials that are suitable for the core dielectric layer of a droplet actuator PCB.

First metal layer 214 and second metal layer 218 are formed of any electrically conductive material, such as copper. In one example, first metal layer 214 may be the copper layer within which one or more electrodes, such as electrode 156 of FIG. 1, are formed, and may have any thickness suitable to the purpose of the droplet actuator. In one example, second metal layer 218 may be the copper layer within which one or more interconnect pads, such as interconnect pad 160 of FIG. 1, are formed, and may have a thickness suitable to the purpose of the droplet actuator. In another example, first metal layer 214 may have a thickness which is less than the thickness of second metal layer 218.

Figure 3:
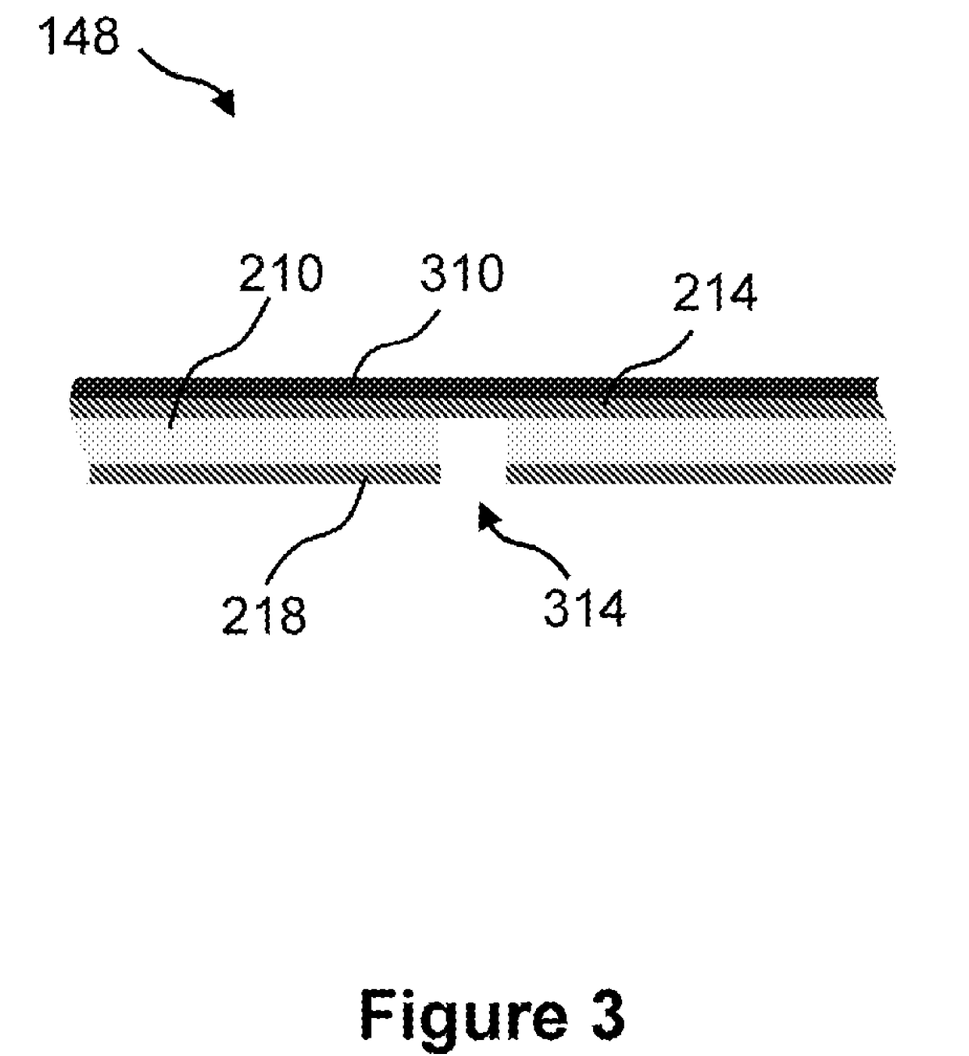
FIG. 3 illustrates an example of a next process step of fabricating a bottom plate of a droplet actuator by applying a photoresist layer on the electrode side metal layer of the core PCB and forming one or more openings in the core dielectric layer and the non-electrode side metal layer.

FIG. 3 illustrates a nonlimiting example of a next process step of fabricating a bottom plate of a droplet actuator, such as bottom plate 114 of droplet actuator 100 of FIG. 1, by use of the improved PCB fabrication process of the invention. More specifically, a next step may include applying a photoresist layer 310 on the metal layer within which the one or more electrodes are to be formed, i.e., the electrode side of core PCB 148. In one example, photoresist layer 310 is applied to first metal layer 214 using standard processes, in order to protect first metal layer 214 during other process steps. Photoresist is a photo-sensitive material used in photolithography.

In this process step, FIG. 3 shows an opening 314 that is formed using standard processes in core dielectric layer 210 and second metal layer 218, but not in first metal layer 214. Opening 314 is formed as a first step in forming a blind via, such as via structure 162 of FIG. 1.

Figure 4:
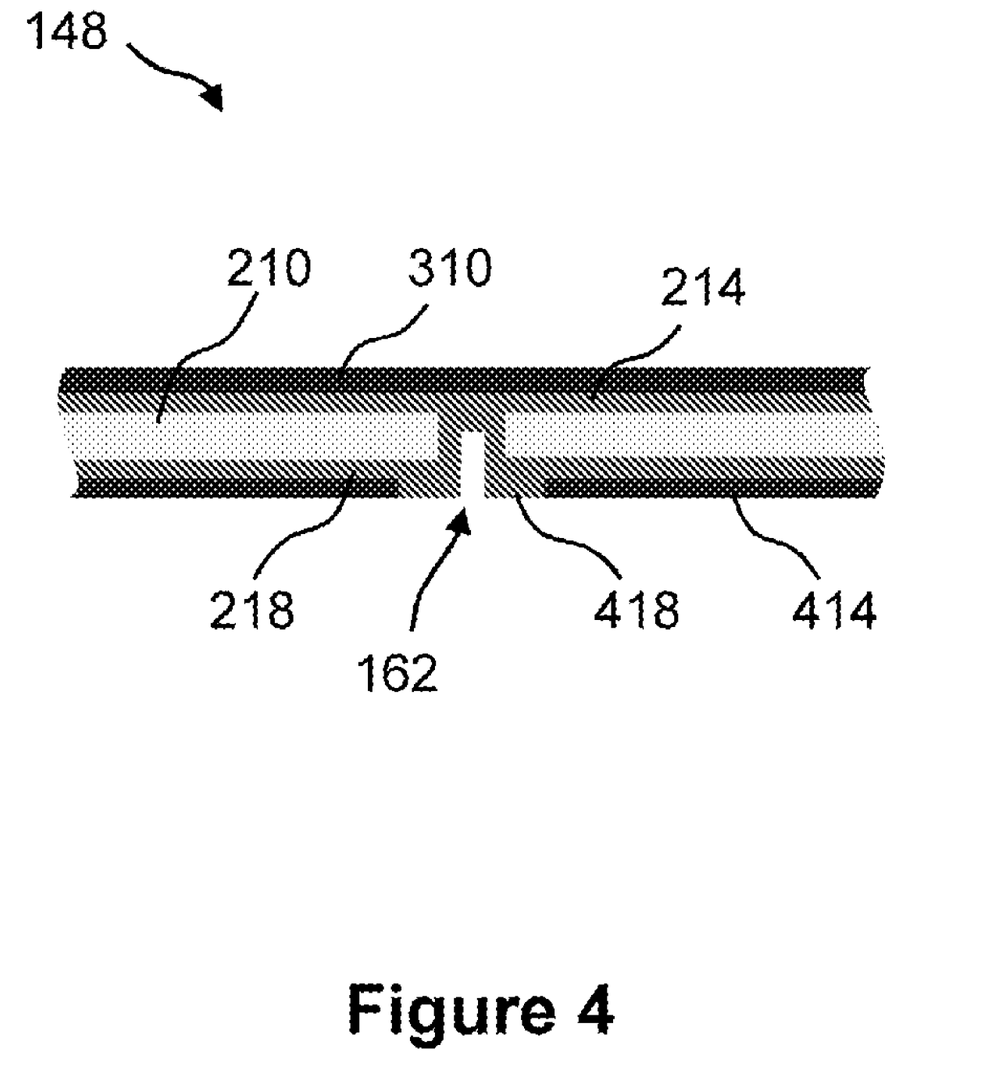
FIG. 4 illustrates an example of a next process step of fabricating a bottom plate of a droplet actuator by applying a photoresist layer on the non-electrode side metal layer of the core PCB and plating the one or more openings, in order to form one or more blind vias.

FIG. 4 illustrates a nonlimiting example of a next process step of fabricating a bottom plate of a droplet actuator, such as bottom plate 114 of droplet actuator 100 of FIG. 1, by use of the improved PCB fabrication process of the invention. More specifically, a next step may include applying a photoresist layer 414 on the metal layer within which the one or more interconnect pads are to be formed, i.e., the non-electrode side of core PCB 148. In one example, photoresist layer 414 is applied to second metal layer 218 using standard processes, in preparation for plating opening 314 as a next step in forming a blind via, such as via structure 162 of FIG. 1. More specifically, an opening in photoresist layer 414 at opening 314 allows metal plating 418 to be applied, as shown in FIG. 4, using standard processes, while protecting second metal layer 218 in all areas away from opening 314. In doing so, an electrical connection is made between first metal layer 214 and second metal layer 218.

Figure 5:
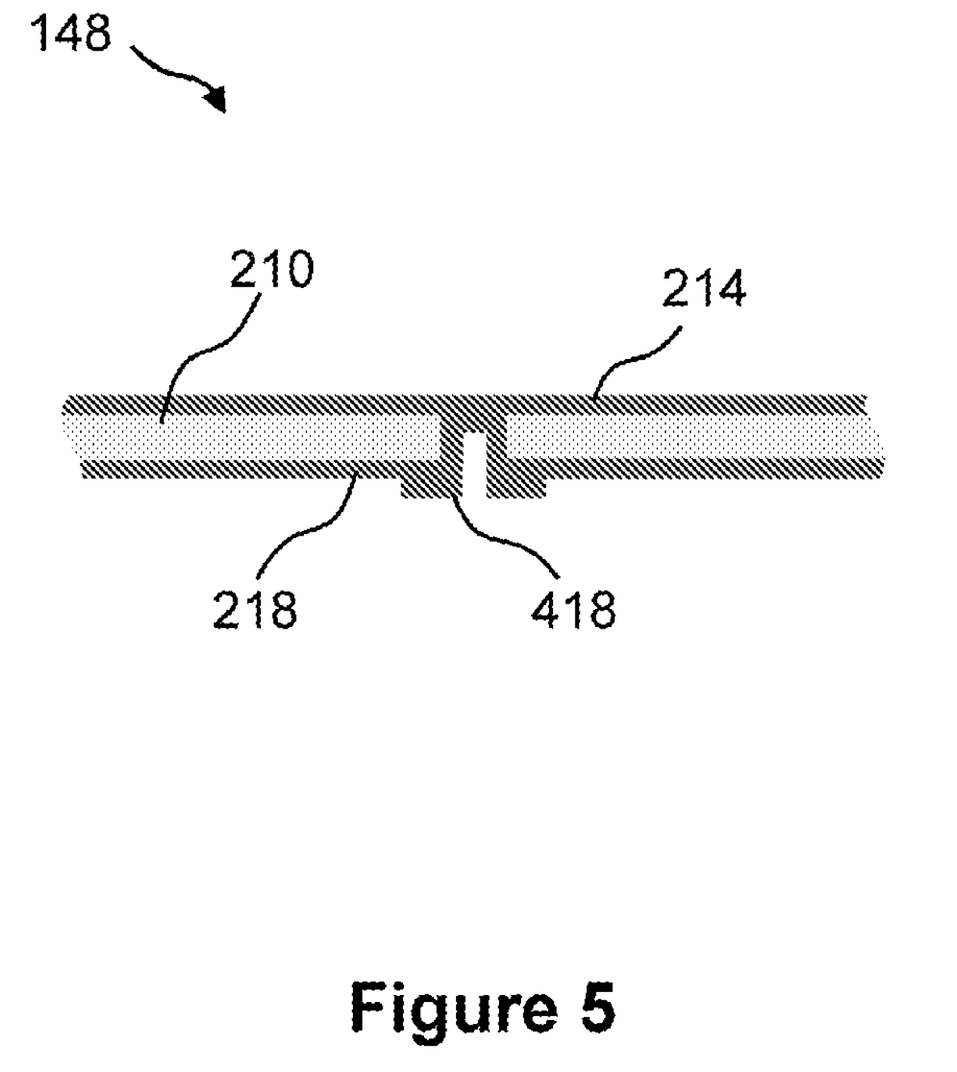
FIG. 5 illustrates an example of a next process step of fabricating a bottom plate of a droplet actuator by stripping the photoresist layer from both the electrode side metal layer and the non-electrode side metal layer of the core PCB.

FIG. 5 illustrates a nonlimiting example of a next process step of fabricating a bottom plate of a droplet actuator, such as bottom plate 114 of droplet actuator 100 of FIG. 1, by use of the improved PCB fabrication process of the invention. More specifically, a next step may include the stripping of photoresist layer 310 and photoresist layer 414 using standard processes. The result is a full metal layer on the electrode side of core PCB 148, a full metal layer on the non-electrode side of core PCB 148, and one or more blind vias fabricated therebetween.

Figure 6:
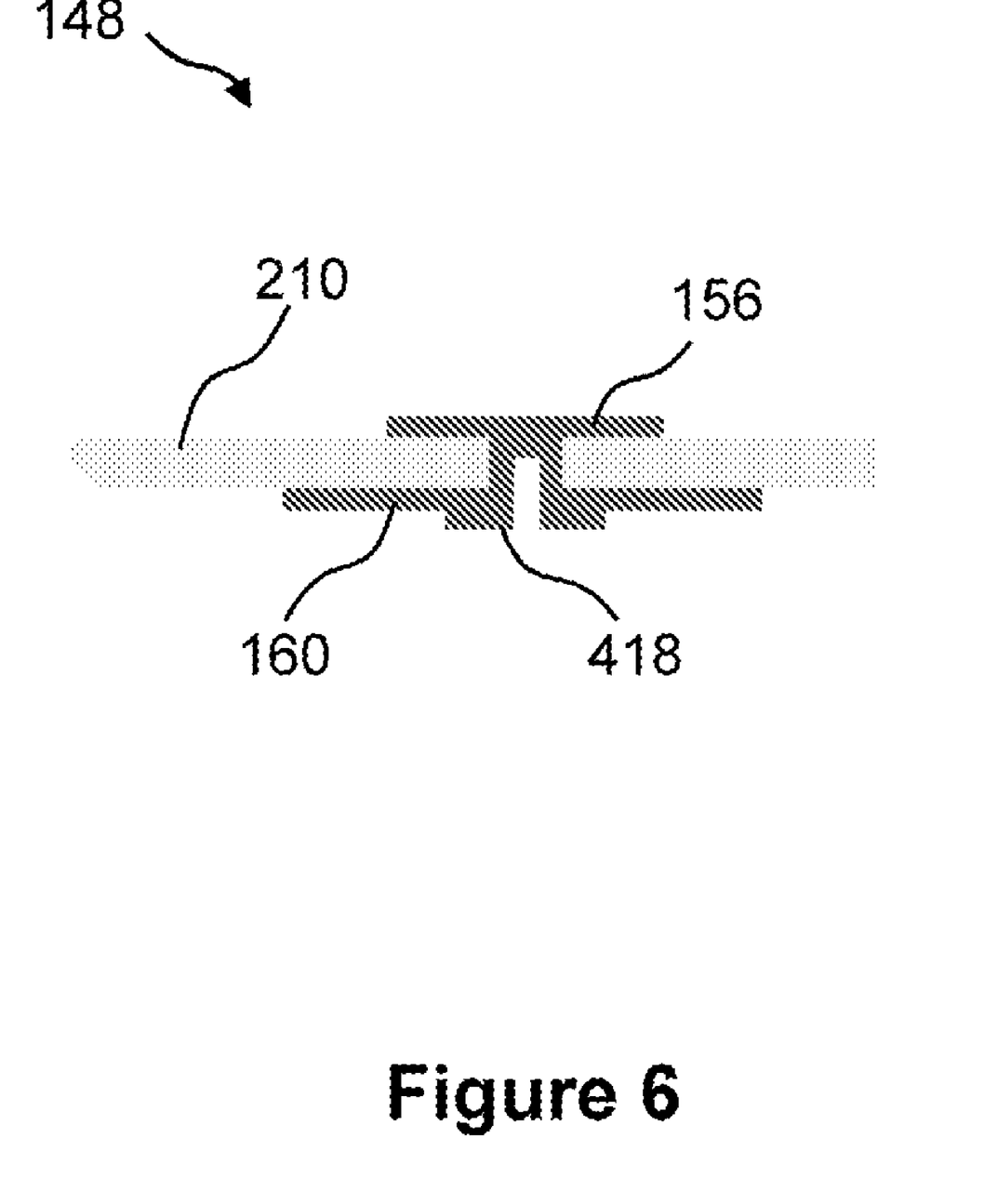
FIG. 6 illustrates an example of a next process step of fabricating a bottom plate of a droplet actuator by patterning the features on both the electrode side metal layer and the non-electrode side metal layer of the core PCB.

FIG. 6 illustrates a nonlimiting example of a next process step of fabricating a bottom plate of a droplet actuator, such as bottom plate 114 of droplet actuator 100 of FIG. 1, by use of the improved PCB fabrication process of the invention. More specifically, a next step may include the "patterning" of both metal layers of core PCB 148. In one example, the metal features that form one or more electrodes 156 are patterned in first metal layer 214, using standard processes. Additionally, the metal features that form one or more interconnect pads 160 are patterned in second metal layer 218, using standard processes.

Figure 7:
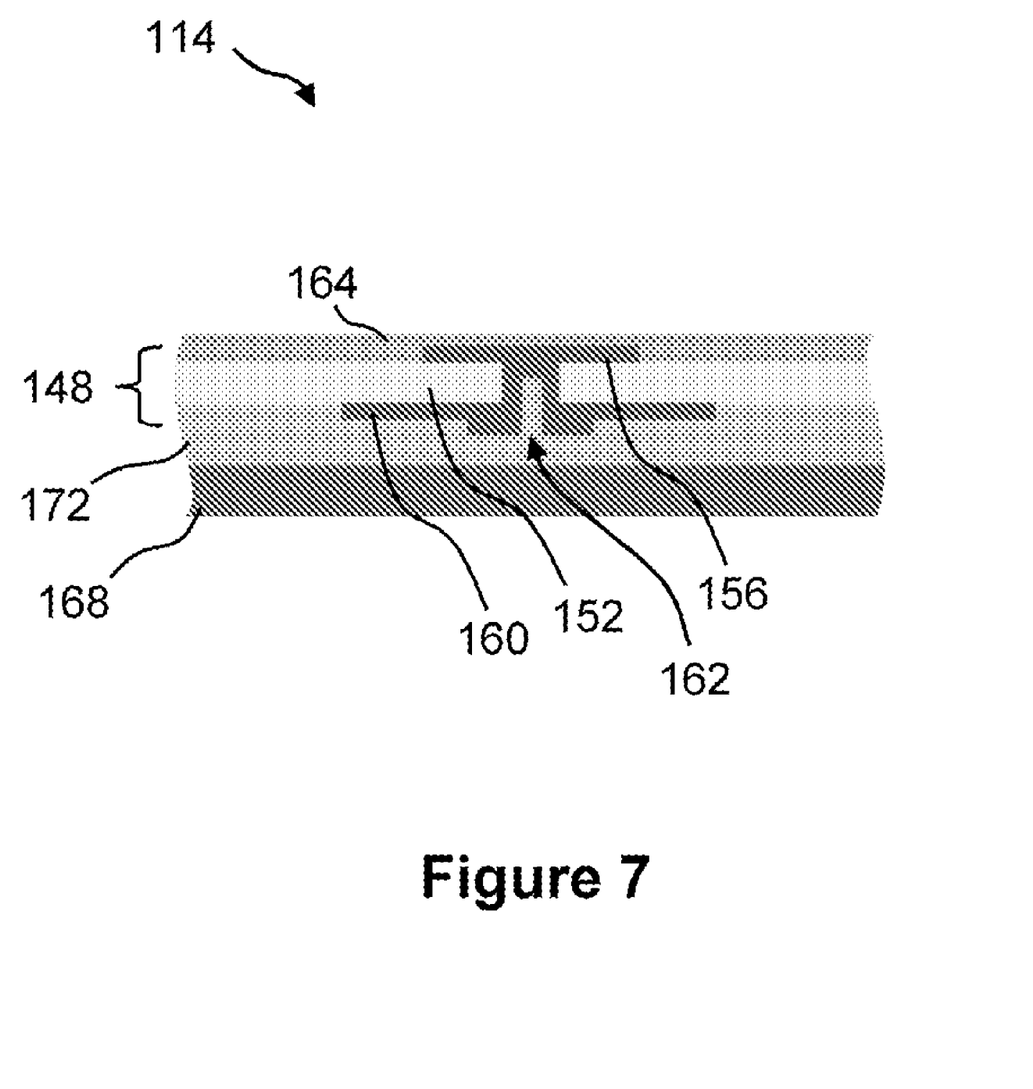
FIG. 7 illustrates an example of a next process step of fabricating a bottom plate of a droplet actuator by applying an electrowetting dielectric layer to the electrode side metal layer of the core PCB and bonding a rigid support structure to the non-electrode side metal layer of the core PCB.

FIG. 7 illustrates a nonlimiting example of a next process step of fabricating a bottom plate of a droplet actuator, such as bottom plate 114 of droplet actuator 100 of FIG. 1, by use of the improved PCB fabrication process of the invention. More specifically, a next step may include laminating the support mechanism to the non-electrode side of core PCB 148 and applying the electrowetting dielectric. For example, the non-electrode side of core PCB 148 is laminated to support structure 168 by use of bonding layer 172 and electrowetting dielectric layer 164 is applied atop the one or more electrodes 156. In one example, the thickness of electrowetting dielectric layer 164 is selected to facilitate use of the device for conducting droplet operations. The material that forms electrowetting dielectric layer 164 is selected for certain desired properties, such as a certain surface smoothness. In one example, electrowetting dielectric layer 164 may be formed of a commercially available polyimide of liquid photoimageable (LPI) soldermask that, when applied, has low roughness. In one example the roughness is less than about 50 nanometers. In another example, the roughness is less than less than about 10 nanometers. In yet another example, the roughness is less than less than about 1 nanometer. Because the irregular metal features are substantially on the non-electrode side of core PCB 148, the smoothness of the electrode side of core PCB 148, which is oriented in the gap of the droplet actuator, may be enhanced and held to a certain desired specification that is suitable for ensuring proper droplet operations. Furthermore, because the thickness of the metal on the electrode side of core PCB 148 is known and uniform, the electrowetting dielectric layer may me applied uniformly and planar. In this way, the electrowetting dielectric layer, upon which a droplet is manipulated, is suitably smooth and flat.

LPI soldermask may be applied by, for example, but not limited to, print screening, dip coating, and spin coating techniques. See section 7.2 "Fabrication Materials" for examples of materials that are suitable for forming electrowetting dielectric layer 164.

In one example, support structure 168 is a rigid glass plate. In one example, bonding layer 172 is a high flow material that flows easily along the topology of the non-electrode side of core PCB 148 in order to efficiently fill the volume around all metal features. Examples of high flow materials include, but are not limited to, thin FR4 Pregreg, which is partially cured epoxy, and partially cured silicone. See section 7.2 "Fabrication Materials" for examples of materials that are suitable for forming bonding layer 172.

Warping is avoided by use of a rigid support structure, such as glass, and a non-adhesive bonding layer, as an adhesive bonding layer is weak. The combination of the rigid support structure and the smoothness and planarity of the electrode side of the core PCB provides a gap tolerance of less than 10% of the expected droplet height. In one example, the gap tolerance may be from about 1% to about 5% of the expected droplet height. In another example, the gap tolerance may be about 1% of the expected droplet height.

7.2 Fabrication Materials

Nonlimiting examples of materials that are suitable for forming the core dielectric layer of a PCB may include, but are not limited to, Kapton® Polyimide Film supplied by DuPont (Wilmington, Del.), liquid crystal polymer (LCP), standard FR4, and Mylar® Polyester Film supplied by DuPont (Wilmington, Del.). Furthermore, the material forming the core dielectric layer of a PCB may be a non-florescent material.

Nonlimiting examples of materials that are suitable for forming the electrowetting dielectric layer, such as electrowetting dielectric layer 164, may include, but are not limited to, liquid photoimageable (LPI) soldermask. Additionally, the material forming the electrowetting dielectric may be a non-florescent material.

Nonlimiting examples of materials that are suitable for forming the bonding layer between the PCB and the support, such as bonding layer 172, may include, but are not limited to, FR4 Pregreg. Furthermore, the material forming the bonding layer may be a non-florescent material.

7.3 Droplet Actuator

For examples of droplet actuator architectures that are suitable for use with the present invention, see U.S. Pat. No. 6,911,132, entitled, "Apparatus for Manipulating Droplets by Electrowetting-Based Techniques," issued on Jun. 28, 2005 to Pamula et al.; U.S. patent application Ser. No. 11/343,284, entitled, "Apparatuses and Methods for Manipulating Droplets on a Printed Circuit Board," filed on filed on Jan. 30, 2006; U.S. Pat. No. 6,773,566, entitled, "Electrostatic Actuators for Microfluidics and Methods for Using Same," issued on Aug. 10, 2004 and U.S. Pat. No. 6,565,727, entitled, "Actuators for Microfluidics Without Moving Parts," issued on Jan. 24, 2000, both to Shenderov et al.; and Pollack et al., International Patent Application No. PCT/US 06/47486, entitled, "Droplet-Based Biochemistry," filed on Dec. 11, 2006, the disclosures of which are incorporated herein by reference.

7.4 Fluids

For examples of fluids that may subjected to droplet operations using the approach of the invention, see the patents listed in section 7.3, especially International Patent Application No. PCT/US 06/47486, entitled, "Droplet-Based Biochemistry," filed on Dec. 11, 2006. In some embodiments, the fluid includes a biological sample, such as whole blood, lymphatic fluid, serum, plasma, sweat, tear, saliva, sputum, cerebrospinal fluid, amniotic fluid, seminal fluid, vaginal excretion, serous fluid, synovial fluid, pericardial fluid, peritoneal fluid, pleural fluid, transudates, exudates, cystic fluid, bile, urine, gastric fluid, intestinal fluid, fecal samples, fluidized tissues, fluidized organisms, biological swabs and biological washes. In some embodiment, the fluid that is loaded includes a reagent, such as water, deionized water, saline solutions, acidic solutions, basic solutions, detergent solutions and/or buffers. In some embodiments, the fluid includes a reagent, such as a reagent for a biochemical protocol, such as a nucleic acid amplification protocol, an affinity-based assay protocol, a sequencing protocol, and/or a protocol for analyses of biological fluids.

7.5 Filler Fluids

The gap is typically filled with a filler fluid. The filler fluid may, for example, be a low-viscosity oil, such as silicone oil. Other examples of filler fluids are provided in International Patent Application No. PCT/US 06/47486, entitled, "Droplet-Based Biochemistry," filed on Dec. 11, 2006.

7.6 Method of Processing a PCB of a Droplet Actuator

A method of fabricating and supporting a PCB of a droplet actuator may include, but is not limited to, one or more of the following steps: (1) providing a core PCB that is formed of a core dielectric layer that has metal layers on both sides, e.g., an electrode side metal layer and a non-electrode side metal layer; (2) applying a photoresist layer on the electrode side metal layer of the core PCB and forming one or more openings in the core dielectric layer and the non-electrode side metal layer; (3) applying a photoresist layer on the non-electrode side metal layer of the core PCB and plating the one or more openings, in order to form one or more blind vias, respectively; (4) stripping the photoresist layer from both the electrode side metal layer and the non-electrode side metal layer of the core PCB; (5) patterning the features on both the electrode side metal layer and the non-electrode side metal layer of the core PCB; (6) applying an electrowetting dielectric layer to the electrode side metal layer of the core PCB; and (7) bonding a rigid support structure to the non-electrode side metal layer of the core PCB.

8 CONCLUDING REMARKS

The foregoing detailed description of embodiments refers to the accompanying drawings, which illustrate specific embodiments of the invention. Other embodiments having different structures and operations do not depart from the scope of the present invention.

This specification is divided into sections for the convenience of the reader only. Headings should not be construed as limiting of the scope of the invention.

It will be understood that various details of the present invention may be changed without departing from the scope of the present invention. Furthermore, the foregoing description is for the purpose of illustration only, and not for the purpose of limitation, as the present invention is defined by the claims as set forth hereinafter.

We claim:

1. A method of manufacturing a droplet actuator for conducting droplet operations, the method comprising:
   (a) positioning a dielectric material between a first metal layer configured to include an electrode and a second metal layer configured to include an interconnect pad;
   (b) forming a connection between the first and second metal layers;
   (c) attaching a rigid support structure onto the second metal layer, wherein the rigid structure is selected to reduce warping caused by the dielectric material; and
   (d) positioning a first plate proximate a second plate comprising the first and second metal layers, the dielectric material and the connection to form a gap between the two plates that provides a fluid flow path for droplet operations, wherein the gap has a gap tolerance of less than 10% of the expected droplet height.

2. The method of claim 1 further comprising applying a photoresist layer onto the first metal layer.

3. The method of claim 1 further comprising stripping a photoresist layer from the first metal layer.

4. The method of claim 1, wherein forming the connection further comprises forming a via connection between the first and second metal layers.

5. The method of claim 1, wherein forming the connection further comprises forming an opening through both the dielectric material and the second metal layer through to the first metal layer.

6. The method of claim 5 further comprising applying a photoresist layer onto the second metal layer in such a manner as to leave the opening exposed.

7. The method of claim 6 further comprising applying a metal plating into the opening to form the connection.

8. The method of claim 7 further comprising stripping the photoresist layer from the second metal layer.

9. The method of claim 1 further comprising forming the electrode from the first metal layer.

10. The method of claim 1 further comprising forming the interconnect pad from the second metal layer.

11. The method of claim 1 wherein the attaching comprises laminating a rigid structure onto the second metal layer using a bonding layer.

12. The method of claim 1, wherein the rigid structure comprises glass structure.

13. The method of claim 1 further comprising applying an electrowetting layer onto the first metal layer.

14. The method of claim 13, wherein applying the electrowetting layer to the first metal layer further comprises applying a dielectric substance onto the first metal layer.

15. The method of claim 13, wherein applying the electrowetting layer onto the first metal layer further comprises applying at least one of a liquid photoimageable soldermask and a non-florescent material onto the first metal layer.

16. The method of claim 1 further comprising applying a photoresist layer onto the second metal layer.

17. The method of claim 1 further comprising stripping a photoresist layer from the second metal layer.

18. The method of claim 1 further comprising forming the dielectric material from non-florescent material.

19. The method of claim 1 further comprising forming the first plate.

20. The method of claim 1, wherein the gap tolerance is from about 1 to about 5%.

21. A droplet actuator for conducting droplet operations, comprising:
   (a) a first plate that includes:
      (i) a first metal layer comprising an electrode;
      (ii) a second metal layer comprising an interconnect pad;
      (iii) a dielectric material positioned between the first and second metal layers; and
      (iv) a via connecting the electrode to the interconnect; and
   (b) a rigid support structure attached to the first plate and selected to reduce warping of the first plate;
   (c) a second plate proximate the first plate and forming a gap therebetween that provides a fluid flow path for the droplet operations, wherein the gap has a gap tolerance of less than 10% of the expected droplet height.

22. The droplet actuator of claim 21 further comprising an electrowetting layer positioned on at least one of the first and second metal layers proximate the gap.

23. The droplet actuator of claim 21, wherein the via comprises metal applied in a hole formed through the second metal layer and the dielectric material.

24. The droplet actuator of claim 23, further comprising a photoresist layer protecting the second metal layer from the applied metal.

25. A method of fabricating and supporting a printed circuit board of a droplet actuator for conducting droplet operations, the method comprising:
   (a) providing a core printed circuit board by positioning a dielectric material between a first metal layer configured to include an electrode and a second metal layer configured to include an interconnect pad;
   (b) applying a photoresist layer onto the first metal layer and forming one or more openings in the dielectric material and the second metal layer;
   (c) applying a photoresist layer onto the second metal layer and plating the one or more openings to form one or more blind vias, thereby forming a connection between the first and second metal layers;
   (d) stripping the photoresist layer from both the first metal layer and the second metal layer;
   (e) patterning the features on both the first metal layer and the second metal layer;
   (f) applying an electrowetting dielectric layer to the first metal layer; and
   (g) bonding a rigid support structure to the second metal layer wherein the rigid support structure ais selected to reduce warping of the printed circuit board, wherein the gap has a gap tolerance of less than 10% of the expected droplet height.

26. The method of claim 25, wherein the gap tolerance is from about 1 to about 5%.

27. A method of manufacturing a droplet actuator for conducting droplet operations, the method comprising:
   (a) providing a printed circuit board (PCB) comprising electrodes arranged for conducting droplet operations;
   (b) attaching a rigid structure to the PCB, wherein the rigid structure reduces warping of the PCB; and
   (c) positioning a plate proximate the PCB to form a gap that provides a fluid flow path for conducting droplet operations;
   wherein the gap has a gap tolerance of less than 10% of the expected droplet height.

28. The method of claim 27, wherein the gap tolerance is from about 1 to about 5%.

* * * * *